United States Patent
Lin et al.

[11] Patent Number: 5,932,900
[45] Date of Patent: Aug. 3, 1999

[54] FLEXIBLE CELL FOR GATE ARRAY

[75] Inventors: Hsiao-Ping Lin, Taipei; Chia-Wei Wang, Hsinchu; Chi-Yi Hwang, Kaohsiung Hsien, all of Taiwan

[73] Assignee: Faraday Technology Corporation, Taiwan, China

[21] Appl. No.: 08/941,083

[22] Filed: Sep. 30, 1997

[30] Foreign Application Priority Data

Jun. 20, 1997 [TW] Taiwan ................................. 86108614

[51] Int. Cl.⁶ .................................................. H01L 27/10
[52] U.S. Cl. .......................... 257/204; 257/202; 257/206
[58] Field of Search ..................................... 257/202, 204, 257/206

[56] References Cited

U.S. PATENT DOCUMENTS

| | | | |
|---|---|---|---|
| 4,692,783 | 9/1987 | Monma et al. ........................ | 257/204 |
| 4,853,757 | 8/1989 | Kuramitsu et al. ...................... | 257/204 |
| 5,493,135 | 2/1996 | Yin .......................................... | 257/204 |

*Primary Examiner*—Valencia Martin-Wallace
*Attorney, Agent, or Firm*—Rabin & Champagne, P.C.

[57] ABSTRACT

The invention provides an improvement in a cell structure for gate arrays. By using the cell in gate arrays, the design flexibility and the symmetry feature of the gate array can be retained. By providing transistors of different sizes, the design can possess more flexibility and more efficiency. Moreover, a denser chip layout can be completed. Thus, average wire lengths used for interconnections in the chip design may be shorter than previously possible. Also, better utilization of available chip area can be made. Thus, it becomes possible to flexibly and optimally use every area of the chip.

15 Claims, 5 Drawing Sheets

FLEXIBLE CELL FOR GATE ARRAY

BACKGROUND OF THE INVENTION

1. Field of the Invention

This invention is related to a basic cell for gate arrays, and more particularly to a structure of a basic cell for gate arrays that are used in complementary metal-oxide silicon (CMOS) designs.

2. Description of Related Art

Because of shorter turn-around time, gate arrays are popularly used in the implementation of very-large-scale-integrated (VLSI) designs. In the manufacturing of an integrated circuit using gate arrays, an array of cells is pre-fabricated on the stage wafers prior to formation of metallization levels. After any circuit design is finished, the task to complete the remainder process is only to program the metal layers. The turn around time of gate array designs is obviously shorter than that for fully custom or standard cell designs. However, the fixed cell structure leads to some design limitations and difficulties.

FIG. 1 is a diagram of a conventional cell for gate arrays. The cell consists of four active areas 110, 120, 130, and 140. Active areas 110 and 120 are for P-type transistors, and the active areas 130 and 140 are for N-type transistors. Each one of the active areas is composed of two transistors. For example, there are two P-type transistors 111A and 111B in the active area 110. There are two P-type transistors 111C and 111D in the active area 120. There are two N-type transistors 112A and 112B in the active area 130. There are two N-type transistors 112C and 112D in the active area 140. Each one of the transistors 111A–111D and 112A–112D has a source terminal, gate terminal, and drain terminal. Two transistors in the same active area share a common source or drain terminal. All rectangles in the diagram, such as those designed by reference number 101, represent possible grids for signal interconnection in this embodiment.

A substrate tap area is arranged between active areas. For example, substrate tap areas 121 and 122 in FIG. 1 are located between active areas 110 and 120, and 130 and 140 respectively. There are multiple substrate taps in the substrate tap areas 121 and 122, for example, substrate contacts 131 and 132. These substrate tap areas 121 and 122 are respectively used to provide a voltage reference to transistors 111A–111D and 112A–121D. For this purpose, the substrate contacts 131 and 132 are connected to an appropriate power bus.

Most traditional gate array cells, for example, gate array cell 100 in FIG. 1, are often used to form a 2-input NAND circuit. Each NAND circuit has four transistors, including two P-type transistors and two N-type transistors. All of the transistors in the gate arrays are of the same, which offers less design flexibility. Most designs need the effect of different-sized transistors to satisfy driveability concerns. When a transistor which must have more driving capacity is necessary to satisfy design requirement, several transistors are connected in parallel to be used for the purpose of increasing driving capability. This will result in the consumption of more silicon area, just to use transistors of the same size.

Moreover, the current flow produced by an N-type transistor is lager than that produced by a P-type transistor. That is, while driving a circuit by a P-type and an N-type transistors with the same size, the time to pull up a voltage by the P-type transistor is slower than the time to pull down the same voltage by the N-type one. This requires that the size of P-type transistors is larger than that of N-type ones to balance pull-up and pull-down time.

Furthermore, all of the aligned P-type and N-type transistors in the cell, such as transistor 111A and transistor 112A in FIG. 1, are disconnected. Most transistors used in the CMOS designs are in pairs, and each pair consists of a P-type and an N-type transistor. Since the gate signals of transistors in each pair usually share the same electrical node, the prior art requires two contacts and a short metal wire in order to form the pair. This increases routing complexity in the cell and will reduce routing resource during chip implementation stage. It also results in more silicon consumption in the chip.

In addition, the substrate tap areas 121 and 122 are located between active areas 110 and 120, 130 and 140 respectively, which makes the body of gate arrays wider because the substrate tap areas 121 and 122 occupy a column of gate arrays in the chip. We have to take the arrangement of substrate tap areas in gate arrays into consideration when we try to avoid area consumption.

Certainly, less design limitations and less silicon consumption are the two major objectives in gate array designs. This invention provides more design flexibility to meet requirements of different designs. It also takes the routing complexity into consideration. This invention accommodates an optimal layout density with minimal waste area and offers an efficient implementation for different CMOS designs.

SUMMARY OF THE INVENTION

It is therefore an objective of the present invention to provide a cell of gate arrays which has better design flexibility. It makes the chip design more efficient and flexible.

It is another objective of the invention to provide a cell of gate arrays which simplifies the routing complexity in the layout. It also improves gate utilization during chip implementation.

In accordance with the foregoing and other objectives of the invention, a cell structure for gate arrays is provided with a first site and a second site. The first site includes two first active areas, one of the first active areas having two P-type transistors and the other one of the first active areas having two N-type transistors. A second site includes two second active areas, one of the second active areas having two P-type transistors and the other one of the second active areas having two N-type transistors. A plurality of substrate taps are located in a spare area in the second site.

According to further aspects of the invention, gate terminals of the P-type and N-type transistors of the first site are connected together and gate terminals of the P-type and N-type transistors of the second site are disconnected.

Moreover, the size of the P-type transistors in the first site is larger than that of the P-type transistors in the second site, and the size of the N-type transistors in the first site is larger than that of the N-type transistors in the second site.

Also, the size of the P-type transistors is larger than that of the N-type transistors in the first and the second site.

The gate array body of the invention is formed in rows. Each row is constituted by interleaving the first and the second sites. No routing channel is preserved between any two adjacent rows. Such an arrangement provides efficient implementation for different designs. It also sharply reduces the wiring complexity and wasted area. Therefore, an optimum silicon utilization can be achieved.

BRIEF DESCRIPTION OF DRAWINGS

The invention can be more fully understood from the following detailed description of the preferred embodiments, with reference made to the accompanying drawings, wherein.

DETAILED DESCRIPTION OF PREFERRED EMBODIMENT

Figure 2:
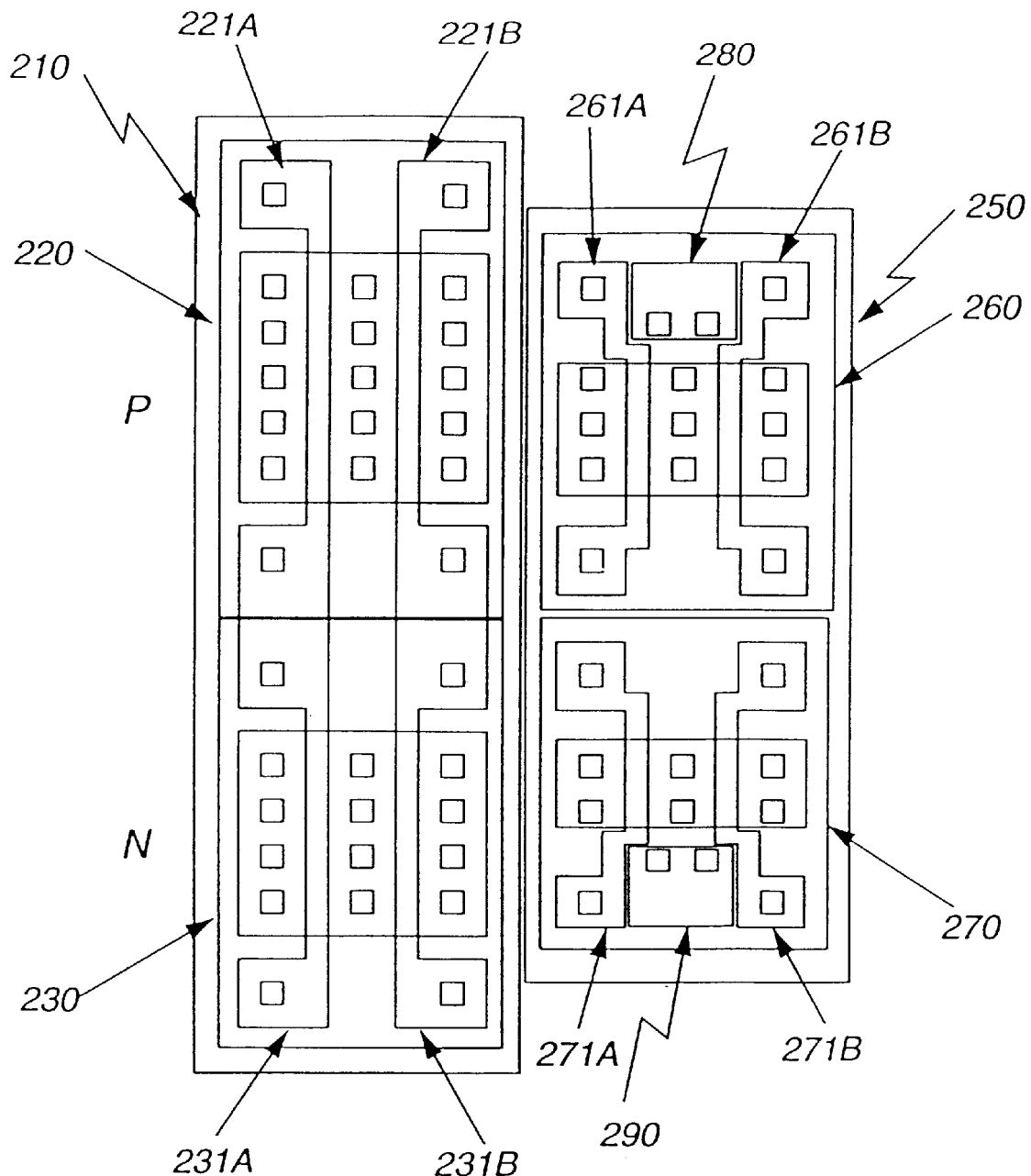
FIG. 2 is a diagram of a preferred embodiment cell according to this invention.

Referring to FIG. 2, a gate array cell 200 of a preferred embodiment of the invention contains two sites 210 and 250. Site 210 has larger transistors in width, and site 250 has smaller ones. Each site consists of two active areas, for example, active areas 220 and 230 in the wider site 210, as well as active areas 260 and 270 in site 250. Active area 220 has two P-type transistors 221A and 221B. The active area 230 has two transistors 231A and 231B. One pair of transistors 221A and 231A are aligned with each other and share a polysilicon gate which directly connects them. The other pair of transistors 221B and 231B are also aligned with each other and share a polysilicon gate which directly connects them.

The active area 260 has two P-type transistors 261A and 261B. The active area 270 has two N-type transistors 271A and 271B. The gates of these transistors are kept disjointed to provide design flexibility. There are two substrate tap areas 280 and 290 in the site 250. The substrate tap area 280 is located between two P-type transistors 261A and 261B, and the other substrate tap area 290 is arranged between two N type transistors 271A and 271B.

The gate array cell 200 shown in FIG. 2 gives more flexibility in CMOS designs because it provides two sites with different transistor size. The site with the larger transistors can be used to implement the driver stages and the site with the smaller transistors can be utilized for the intermediate stages of a design. To balance the time for the voltage pull-up and pull-down during circuit operation, the size of an N-type transistor is smaller than that of a P-type one in each site.

Figure 1:
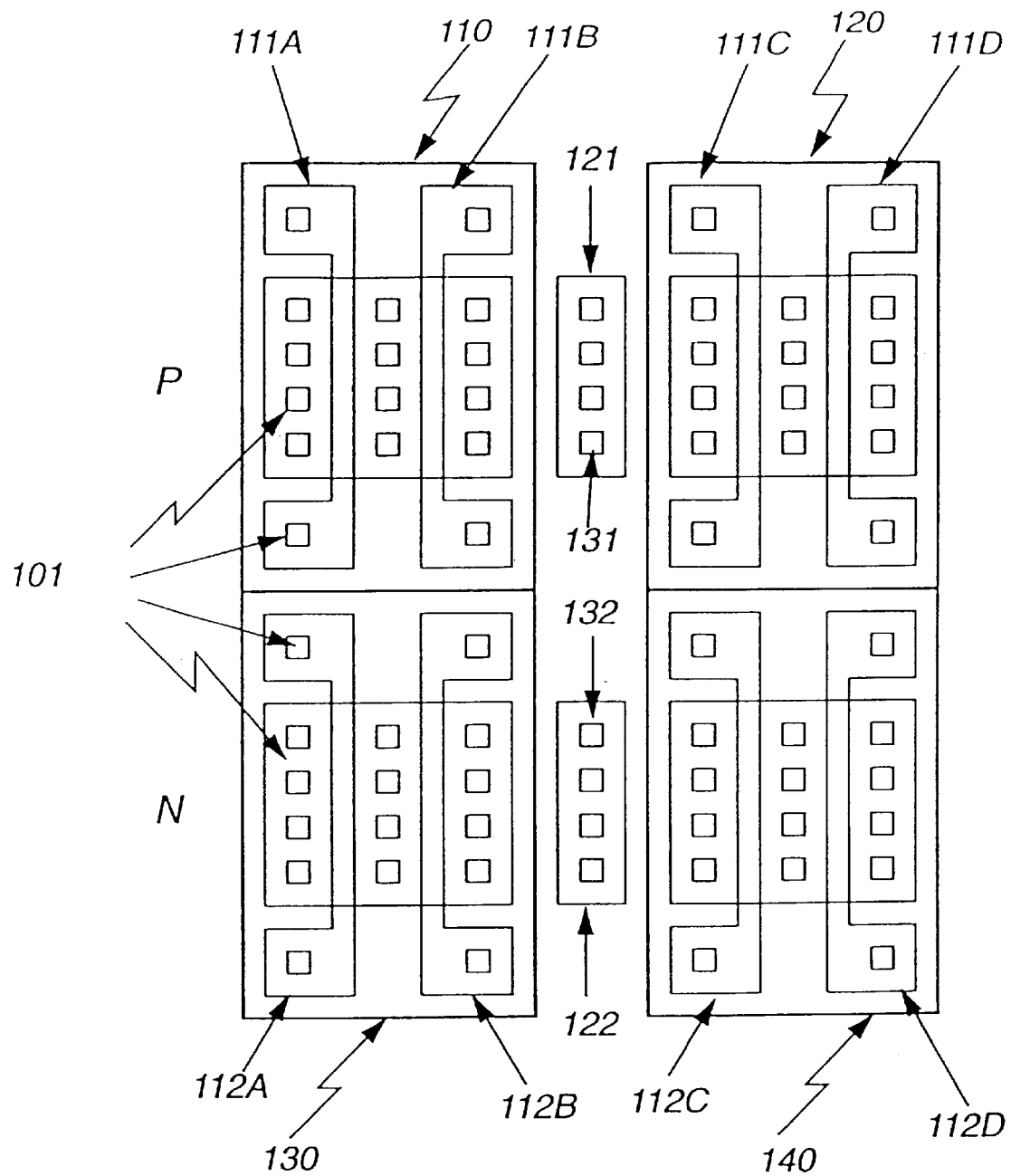
FIG. 1 is a diagram of a prior art conventional cell for a gate array.

Moreover, the gates of the aligned transistors in the site with larger transistors are connected together to reduce wiring complexity. Substrate taps are arranged in the site with smaller transistor for further saving of silicon area. In the prior art, the substrate taps are located between two adjacent cells. Therefore, the substrate taps require excessive space within the silicon area, as shown in FIG. 1. However, the cell 200 in FIG. 2 utilizes the spare area to accommodate the substrate taps. This results in efficient utilization of silicon area.

Figure 3:
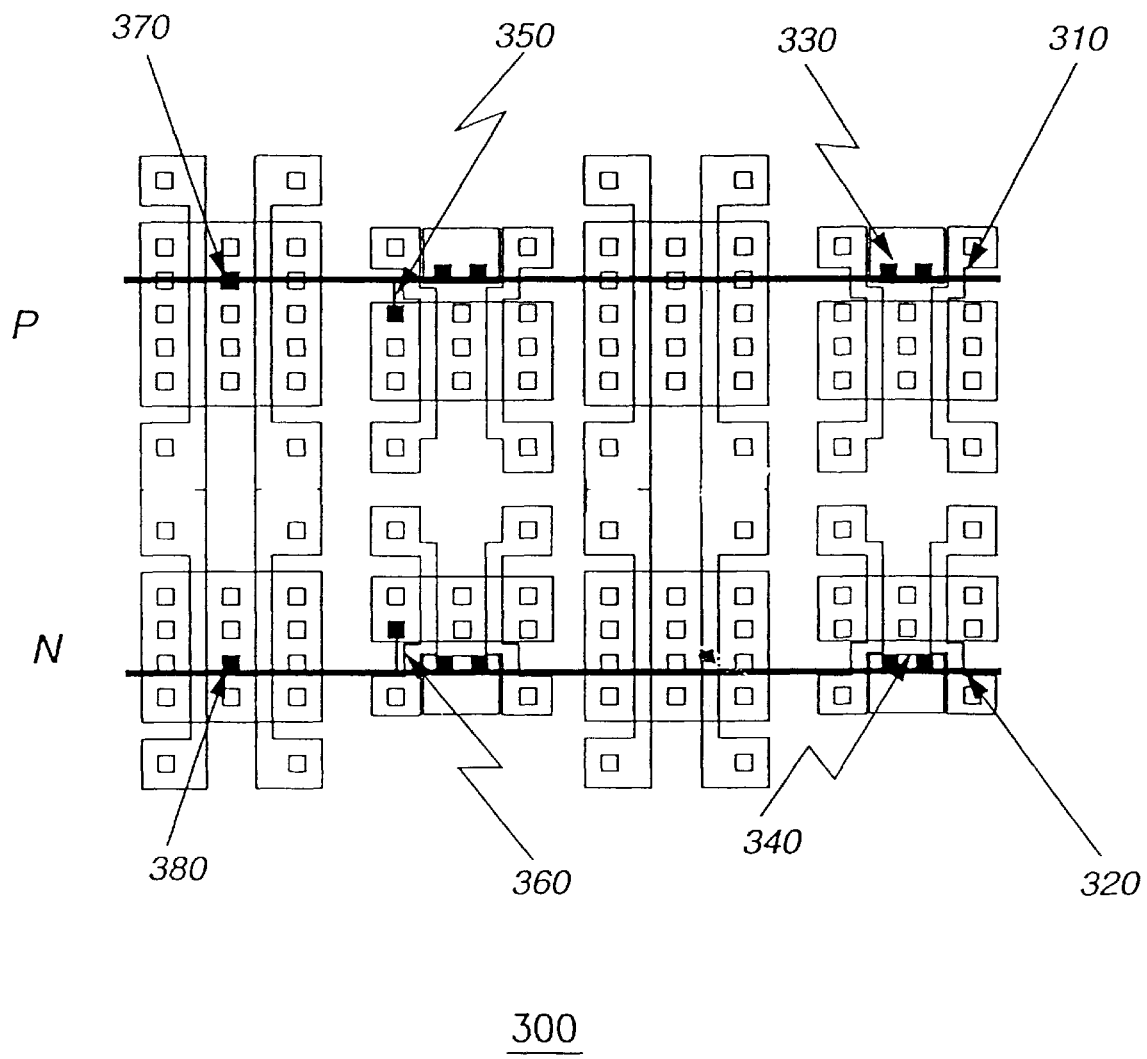
FIG. 3 is a layout of power/ground connections in the cell depicted in FIG. 2.

The cell structure of the invention simplifies the power/ground connections, hence, and reduces the wiring complexity. FIG. 3 shows an example of a power routing method based on the gate array architecture utilizing the cell 200 shown in FIG. 2. Because a layout of power/ground connections for each cell of a gate array is fundamental, a simplified layout of power/ground connections for a cell can substantially reduce the overall complexity of wiring of the gate arrays.

Referring to FIG. 3, the bold line 310 represents a power rail for the P-type transistors, and the bold line 320 is a ground rail for the N-type transistors. The contacts 330 and 340 are used for the substrate taps to be connected to the power and ground rails, respectively. Based on such an arrangement, it is simpler to connect the transistors to power/ground rails. In the site with larger transistors only one contact is needed to connect the source terminal of a transistor to the power/ground rail. For instance, the contact 370 used for the P-type transistor is connected to the power rail 310, and the contact 380 utilized for the N-type transistor is connected to the ground rail.

In the site with smaller transistors besides a contact, a short metal wire is needed to complete the power/ground connection. For example, the wire 350 in FIG. 3 is used to provide a connection between the source terminal of a P-type transistor and the power rail 310. Furthermore, the wire 360 provides a connection between the source terminal of an N-type transistor and the ground rail 320. In contrast, the prior art makes the routing more difficulty and requires more metal wires for power/ground connections. Obviously, the invention not only saves a lot of metal wires for substrate taps but also simplifies the power/ground connections. It simplifies the intra-cell routing and provides more resources for routing for the final stages of chip implementation.

Figure 4A:
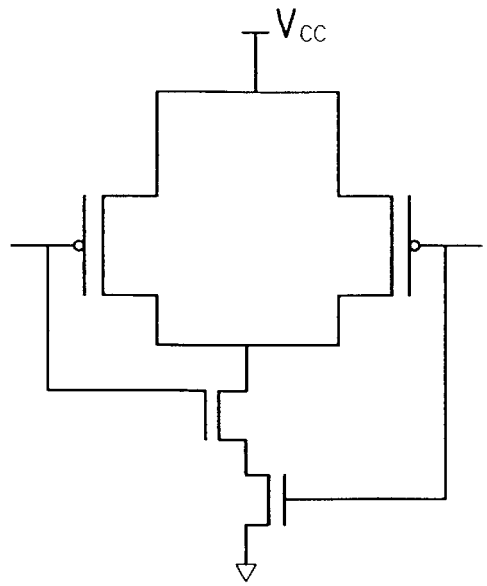
FIGS. 4A–4B is a schematic and layout for a 2-input NAND circuit which utilizes the cell in FIG. 2.
Figure 4B:
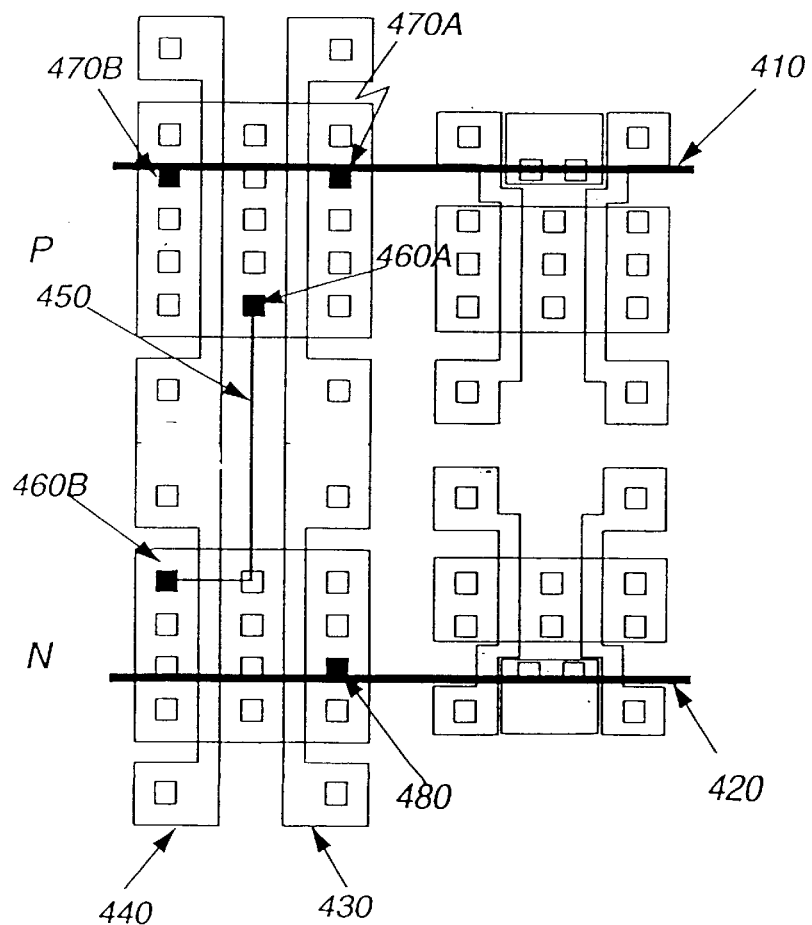

Another circuit which can use the cell shown in FIG. 2 is described hereinafter. FIG. 4A is a circuit diagram of a NAND circuit and FIG. 4B shows a layout of a NAND circuit implemented with the base cell shown in FIG. 2. Based on the invention, the layout is simplified and implemented by using a larger site of the cell. The bold wire 410 represents a power rail, and the bold wire 420 is a ground rail. The 2-input NAND circuit has input terminals 430 and 440, and an output terminal 450. In the stick layout, it will be easily completed with five contacts and a metal wire. Because the aligned transistors in the site of larger transistors have a common gate, wires are not required to connect gates of aligned transistors as in the prior art.

Source terminals of P-type transistors are connected to power rail 410 via contacts 470A and 470B. Source terminals of N-type transistors are connected to ground rail 420 via contact 480. The metal wire 450 and two contacts 460A and 460B are used to form an output node of the NAND circuit. Therefore, this kind of connection of aligned transistors has reduced complexity of connections.

Figure 5A:
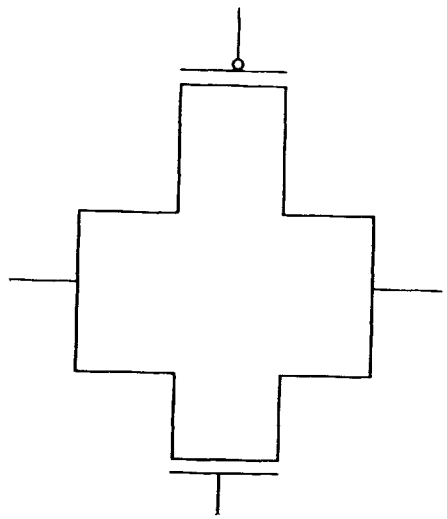
FIGS. 5A–5B shows a schematic and layout for a transmission gate circuit which utilizes the cell in FIG. 2.
Figure 5B:
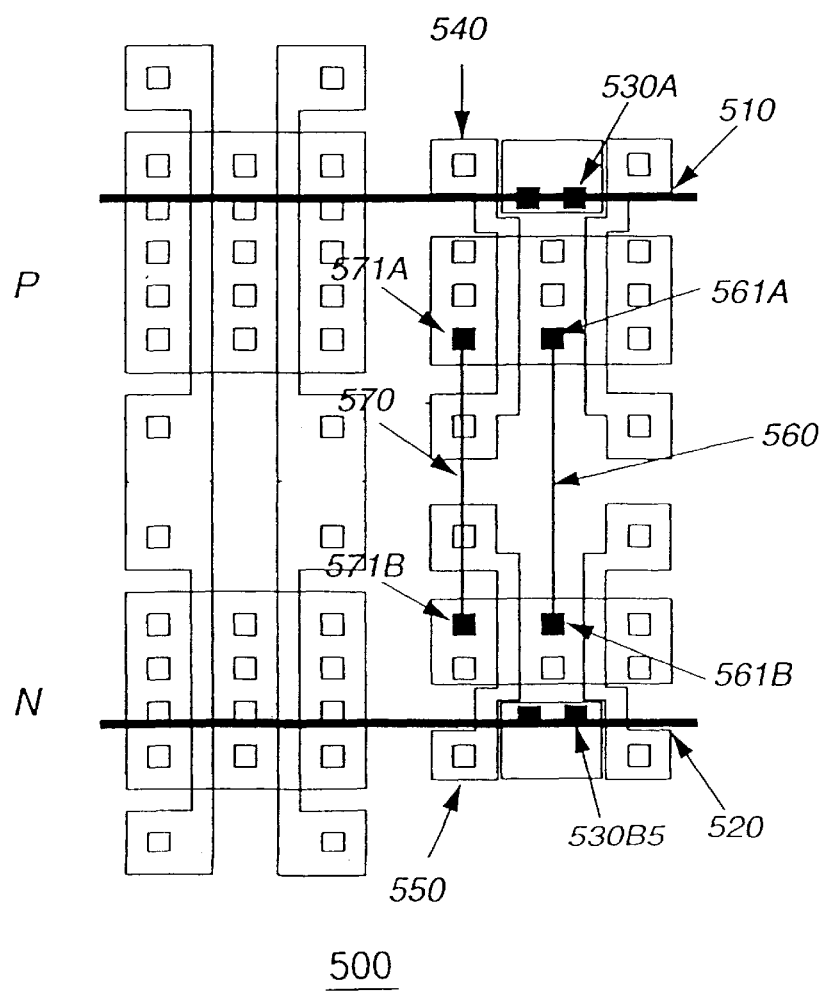

In order to increase flexibility in designs utilizing the cell shown in FIG. 2, the gate terminals of transistors in the site of smaller transistors are disconnected. FIGS. 5A and 5B illustrate an example showing the stick layout of a transmission gate. The bold lines 510 and 520 correspond respectively to a power rail and a ground rail. Contact 530A is used as a substrate contact for P-type transistors, and contact 530B is used as a substrate contact for N-type transistors.

To complete the layout of a transmission gate, only the two left-hand transistors of FIG. 5B in site of the smaller transistors are utilized. Terminals for receiving control signals for controlling the transmission gate are provided in the transistors of 540 and 550 shown in FIG. 5B. Source terminals of the transistors in the transmission gate are connected, and their drain terminals also share the same signal. Therefore, the wire 560 and contacts 561A and 561B are used for the purpose of sharing a source terminal. Also, the wire 570 and contacts 571A and 571B are utilized to form the shared drain terminal. It is easily understood from the above that the cell of gate arrays can be applied for variant CMOS designs. Thus, the invention provides more flexibility both in layout and design.

According to the above description, it is easily understood that utilizing the basic cell of the invention to complete an integrated circuit design has many advantages. For example, the symmetry feature of the gate array design can be retained. Moreover, a denser chip layout can be completed. Also, better utilization of silicon area can be made. Thus, it becomes possible to flexibly and optimally use every area of the chip.

In conclusion, features of the invention include:
(1) better design flexibility, so that chip design may be more efficient and flexible,
(2) simpler wiring, so as to reduce the routing complexity,
(3) symmetry structure, the gate utilization may be increased.

The invention has been described with reference to preferred embodiments. However, it is easy to be understood that the scope of this invention is not limited to the disclosed embodiments. To the contrary, the invention is intended to cover various modifications and similar arrangements. The scope of the claims, therefore, should be accorded the broadest interpretation so as to encompass all such modifications and similar arrangements.

What is claimed is:

1. A cell for use in a gate array, comprising:
    a first site, including two first active areas, one of the first active areas having two P-type transistors and the other of the first active areas having two N-type transistors;
    a second site, including two second active areas, one of the second active areas having two P-type transistors and the other of the second active areas having two N-type transistors, wherein the transistors of the second site are smaller than the transistors of the first site in size; and
    a plurality of substrate taps, located in the cell in the second site.

2. A cell as claimed in claim 1, wherein parts of the substrate taps are located in a first portion between the two P-type transistors, and the others of the substrate taps are located in a second portion between the two N-type transistors.

3. A cell as claimed in claim 1, wherein gate terminals of the P-type and N-type transistors in the first active area of the first site are connected together by a common gate and gate terminals of the P-type and N-type transistors of the second active area of the second site are disconnected.

4. A cell as claimed in claim 1, wherein the P-type transistor of the first site is larger than the P-type transistor of the second site, and the N-type transistor of the first site is larger than the N-type transistor of the second site.

5. A cell as claimed in claim 1, wherein the P-type transistor is larger than the N-type transistor in each of the first and the second site.

6. A cell for use of a gate array, comprising:
    a first site, including two first active areas, one of the first active areas having two P-type transistors and the other one of the first active areas having two N-type transistors;
    a second site, including two second active areas, one of the second active areas having two P-type transistors and the other of the second active areas having two N-type transistors, wherein the transistors of the second site are smaller than the transistors of the first site; and
    a plurality of substrate taps, located between the two second active areas in the second site, wherein parts of the substrate taps are located in a first portion between the two P-type transistors, and the others of the substrate taps are located in a second portion between the two N-type transistors.

7. A cell as claimed in claim 6, wherein gate terminals of the P-type and N-type transistors of the first active area of the first site are connected together by common gate and gate terminals of the P-type and N-type transistors of the second active area of the second site are disconnected.

8. A cell as claimed in claim 6, wherein the P-type transistor of the first site is larger than the P-type transistor of the second site, and the N-type transistor of the first site is larger than the N-type transistor of the second site.

9. A cell as claimed in claim 6, wherein the P-type transistor is larger than the N-type transistor in each of the first and second site.

10. A cell for use in a gate array, comprising:
    a first site, including two first active areas, one of the first active areas having two P-type transistors and the other one of the first active areas having two N-type transistors;
    a second site, including two second active areas, one of the second active areas having two P-type transistors and the other one of the second active areas having two N-type transistors,
    wherein the transistors of the second site are smaller than the transistors of the first site in size and
    wherein gate terminals of the P-type and N-type transistors of the first active area of the first site are connected together by a common gate and gate terminals of the P-type and N-type transistors of the second active area of the second site are disconnected; and
    a plurality of substrate taps, located between the two second active areas of the second site.

11. A cell as claimed in claim 10, wherein the P-type transistor of the first site is larger than the P-type transistor in the second site, and the N-type transistor of the first site is larger than the N-type transistor of the second site.

12. A cell as claimed in claim 11, wherein the P-type transistor is larger than the N-type transistor in each of the first and second sites.

13. A gate array, comprising a plurality of cell, wherein each of the cells comprising:
    a first site, including two first active areas, one of the first active areas having two P-type transistors and the other of the first active areas having two N-type transistors; and
    a second site, including two second active areas, one of the second active areas having two P-type transistors and the other of the second active areas having two N-type transistors, wherein the transistors of the second site are smaller than the transistors of the first site.

14. A gate array, comprising a plurality of cell, wherein each of the cells comprising:
    a first site, including two first active areas, one of the first active areas having two P-type transistors and the other of the first active areas having two N-type transistors; and
    a second site, including two second active areas, one of the second active areas having two P-type transistors and the other of the second active areas having two N-type transistors, wherein gate terminals of the P-type and N-type transistors in the first active area of the first site are connected together by a common gate and gate terminals of the P-type and N-type transistors of the second active area of the second site are disconnected.

15. A gate array, comprising a plurality of cell, wherein each of the cells comprising:
  a first site, including two first active areas, one of the first active areas having two P-type transistors and the other of the first active areas having two N-type transistors;
  a second site, including two second active areas, one of the second active areas having two P-type transistors and the other of the second active areas having two N-type transistors, wherein the transistors of the second site are smaller than the transistors of the first site; and
  a plurality of substrate taps, located of the cell between the two second active areas of the second site.

* * * * *